United States Patent [19]

Arneth et al.

[11] Patent Number: 5,302,487
[45] Date of Patent: Apr. 12, 1994

[54] NEGATIVE-WORKING PHOTOSENSITIVE COATING SOLUTION CONTAINING PHOTOHARDENABLE DIAZO COMPOUND, POLYMERIC BINDER AND FOUR COMPONENT SOLVENT

[75] Inventors: Reinhold Arneth, Budenheim; Eberhard Hehl, Ingelheim; Werner Frass, Wiesbaden; Guenter Jung, Taunusstein-Hahn, all of Fed. Rep. of Germany

[73] Assignee: Hoechst Aktiengesellschaft, Frankfurt am Main, Fed. Rep. of Germany

[21] Appl. No.: 898,345

[22] Filed: May 19, 1992

Related U.S. Application Data

[63] Continuation of Ser. No. 558,485, Jul. 27, 1990, abandoned.

[30] Foreign Application Priority Data

Jul. 27, 1989 [DE] Fed. Rep. of Germany ....... 3924812

[51] Int. Cl.⁵ .................. G03F 7/021; G03F 7/09
[52] U.S. Cl. .................. 430/157; 430/175; 430/176; 430/278
[58] Field of Search ........... 430/157, 175, 176, 270, 430/278

[56] References Cited

U.S. PATENT DOCUMENTS

| | | | |
|---|---|---|---|
| 4,301,234 | 11/1981 | Uhlig | 430/175 |
| 4,387,151 | 6/1983 | Bosse et al. | 430/175 |
| 4,539,285 | 9/1985 | Duval et al. | 430/175 |
| 4,659,645 | 4/1987 | Frommeld et al. | 430/175 |
| 4,661,432 | 4/1987 | Lutz et al. | 430/175 |
| 4,764,450 | 8/1988 | Ruckert et al. | 430/191 |
| 4,845,008 | 7/1989 | Nishioka et al. | 430/165 |
| 4,929,533 | 5/1990 | Nishikawa et al. | 430/169 |

FOREIGN PATENT DOCUMENTS

| | | |
|---|---|---|
| 89506 | 9/1983 | European Pat. Off. . |
| 96345 | 11/1979 | Fed. Rep. of Germany . |
| 2021276 | 11/1979 | United Kingdom . |

OTHER PUBLICATIONS

Stiehler et al, Chemical Abstracts, vol. 79, No. 26, p. 361 (No. 151655z "Photoresist Lacquers") Dec. 31, 1973.

Primary Examiner—Charles L. Bowers, Jr.
Assistant Examiner—Christopher G. Young
Attorney, Agent, or Firm—Foley & Lardner

[57] ABSTRACT

The invention describes a solvent mixture for photohardenable compositions, which includes
(a) a first component having
(i) a first constituent of
(aa) a polar solvent of the formula R-OH, wherein R is a H or alkyl, or
(aa') a monoalkylether or an alkylether ester of a glycol and constituent of
(ii) a second an organic solvent having a boiling point in the range of from about 60° to 160° C. and comprising an aliphatic ketone, an alkanoic acid alkylester, a hydroxyalkanoic acid alkylester or a cyclic ether, in quantitative proportions selected to form a homogeneous mixture, and
b) from about 0.1 to 8% by weight, relative to the total solvent mixture, of another solvent, the boiling point of which is higher than each individual boiling point of the constituents of the first component (a). The solvent mixture is used to obtain coating solutions layers which have a higher photosensitivity than corresponding layers prepared without the addition of component (b).

22 Claims, No Drawings

NEGATIVE-WORKING PHOTOSENSITIVE
COATING SOLUTION CONTAINING
PHOTOHARDENABLE DIAZO COMPOUND,
POLYMERIC BINDER AND FOUR COMPONENT
SOLVENT

This application is a continuation application of Ser. No. 07/558,485, filed Jul. 27, 1990, now abandoned.

The present invention relates to solvent mixtures which can be used in the production of negative-working photosensitive recording materials, in particular materials containing a diazonium salt polycondensation product and a polymeric binder. The solvent mixtures are especially useful in the manufacturing of printing plates.

For manufacturing printing plates, a photosensitive composition is required which is dissolved in appropriate compatible solvents and the solution obtained is coated upon a support material and then dried to form a layer.

U.S. Pat. No. 4,387,151 describes negative-working photosensitive compositions which contain a diazonium salt polycondensation product or an azido compound and, as a binder, a high-molecular polymer with sulfonylurethane side groups. The solvents specified for these negative-working photosensitive compositions comprise alcohols, ketones, esters and ethers, preferably partial ethers of glycols or ketoalcohols. In the examples ethylene glycol monomethylether is used, which is in some cases combined with tetrahydrofuran or butyl acetate. Further solvents mentioned comprise ethylene glycol monoethylether, acetone alcohol, and mixtures of the solvents with butyl acetate, ethylene glycol monomethylether acetate and methylisobutyl ketone.

Many of these solvents have a good dissolving power for the negative-working photosensitive compositions, but their TLV (threshold limit values and biological tolerance values for working materials) are very low (ethylene glycol monomethylether: TLV=5 ml/m3; ethylene glycol monoethylether: TLV=20 ml/m3) and consequently particularly expensive safety precautions have to be taken at the work site when these solvents are employed.

U.S. Pat. No. 4,764,450 describes solvents for positive-working radiation-sensitive compositions containing, as the essential compound, for example a 1,2-naphthoquinone diazide, or a radiation-sensitive combination of compounds, for example a compound having at least one acid-cleavable C—O—C bond and a compound forming a strong acid upon irradiation. The solvent used then contains essentially a mono-$C_1$ to $C_4$ alkylether of 1,2-propanediol.

In DE-A 36 27 585 a process for manufacturing a pre-sensitized planographic printing form is described, wherein an aluminum sheet is coated with a solution prepared with a solvent which contains at least 10% by weight of 1-methoxy-2-propanol. Further solvent constituents used comprise ketones, esters, cyclic ethers, such as tetrahydrofuran, alcohols, halogenated hydrocarbons, dimethylformamide, butyrolactone and others. The methoxypropanol is stated to reduce the printing form's tendency towards scumming, the other solvents do not have any particular effect and are interchangeable.

DE-A 37 05 342 describes a coating solution for use in the production of positive-working photosensitive recording materials. The solvent employed for preparing the solution is a mixture of three components having different boiling points. The mixture permits rapid, continuous drying of the solution to form a layer which exhibits high overdevelopment resistance, mechanical resistance and oleophilic properties. The solvent constituents used are ketones, esters, glycol monoalkylethers and halogen alkanes.

The solvent constituent hitherto most frequently used for photosensitive compositions based on negative-working diazonium salt polycondensation products and polymeric binders comprises a glycol ether, in particular 2—methoxyethanol. However, since harmful effects of this preferred solvent have lately become known and, as a result of this, threshold limit values have been drastically lowered, it has become necessary to replace this solvent by others which are less harmful. The homologous propylene glycol ethers described in the prior art, which have higher threshold limit values have therefore been adopted. In general, however, these ethers, used as the sole solvents, cannot dissolve diazonium salt polycondensation products and, consequently, mixtures with ketones, esters, alcohols, water and others have been employed, which have an adequate dissolving power.

It has been determined that photosensitive layers on a basis of diazonium salt polycondensation products, which have been applied from solvent mixtures of this kind, have a photosensitivity which is, in general, reduced by 1 to 2 wedge steps, that is to say by a factor of 1.4 to 2, as compared to layers of the same composition coated from 2-methoxy-ethanol as the sole or principal solvent. In addition, these layers show a flatter gradation.

SUMMARY OF THE INVENTION

It is therefore an object of the present invention to provide a solvent mixture for the production of photosensitive recording materials, in particular printing plates, which does not give rise to any loss of photosensitivity or any flattening of gradation of the layers obtained therewith, as compared with materials hitherto obtained with the best coating solvents known in the art.

It also is an object of the present invention to provide a coating solution for the production of photosensitive recording materials and a photosensitive recording material, especially a planographic printing plate, which has improved photosensitivity and gradation.

In accomplishing the foregoing objects there is provided according to the present invention a solvent mixture for photohardenable compositions for use in the production of photohardenable recording materials, which comprises
 (a) a first component comprising
  (i) a first constituent comprising either
   (aa) a polar solvent of the formula R—OH, wherein R is a hydrogen atom or an alkyl group having from 1 to 3 carbon atoms, or
   (aa') a monoalkylether or an alkylether ester of a glycol having 2 or 3 carbon atoms and
  (ii) a second constituent comprising an organic solvent having a boiling point in the range of from about 60° to 160° C. and which is selected from the group consisting of an aliphatic ketone, an alkanoic acid alkylester, a hydroxyalkanoic acid alkylester and a cyclic ether in quantitative proportions selected to form a homogeneous mixture, and (b) from about 0.1 to 8% by weight, relative to the total solvent mixture, of a second component comprising a solvent, the boiling point of which is higher than each individual boiling point of the constituents of the first component (a).

The present invention further provides a coating solution for the production of a photosensitive recording material, comprising a photohardenable compound, a polymeric binder, and the above-described solvent mixture.

The present invention also provides a photosensitive recording material comprising a support and a photohardenable layer obtained by applying the above-described coating solution to the support and drying.

Further objects, features and advantages of the present invention will become apparent from the detailed description of the preferred embodiments that follows.

DETAILED DESCRIPTION OF THE PREFERRED EMBODIMENTS

By the addition, according to the present invention, of the high-boiling solvent (b), the layers obtained using the solvent mixtures on a basis of propylene glycol ethers have a photosensitivity which is at least equal to that obtained by means of solvents on a basis of ethylene glycol ethers. It has even been found unexpectedly that the photosensitivity and gradation of coatings applied from solvents based on ethylene glycol ethers can be further improved by adding the above-defined high-boiling solvents.

The solvent mixture of the present invention comprises a relatively low-boiling constituent (i) including, as a polar solvent (aa), water or a lower aliphatic alcohol, such as methanol, ethanol, n-propanol or isopropanol. The mixture further contains a component (ii) having a boiling point in the range from about 60° to 160° C. and comprising, for example, a ketone having from 3 to 6 carbon atoms, for example acetone, butanone, pentanone or methylisobutyl ketone; an ester of an alkanoic or hydroxyalkanoic acid preferably having from 2 to 5 carbon atoms, for example acetic, propionic, butyric, glycolic or lactic acid, with an alkanol having from 1 to 4 carbon atoms; or a saturated cyclic ether, for example tetrahydrofuran, tetrahydropyran or 1,4-dioxane. The ester has a total of 3 to 8, preferably 4 to 6, carbon atoms.

In addition, the mixture includes a solvent (b) which has a higher boiling point than the components of (a), in particular a boiling point in the range from about 160° to 300° C., preferably from about 160° to 250° C., particularly from about 185° to 250° C. This solvent may comprise a lactone, such as butyrolactone or valerolactone or another cyclic ester, such as ethylene carbonate or propylene carbonate, a sulfoxide, such as dimethylsulfoxide or diethylsulfoxide, a glycol ether, in particular a diglycol ether, for example diethylene glycol dimethylether or diethylene glycol monoethylether or a lactam, such as N-methyl or N-ethylpyrrolidone.

Preferably, the mixture contains a further component (c) which has a boiling point in the range from about 120° to 180° C. and comprises a monoalkylether or an alkylether ester of ethylene or propylene glycol, in which the alkyl groups may have from 1 to 4, preferably 1 or 2, carbon atoms and the acyl group may have from 2 to 4 carbon atoms.

The component (c) may also comprise an alkyl ester of a hydroxyalkanoic acid provided (ii) does not comprise an alkylester of this type. Similarly, (c) can only comprise a glycol ether or a glycol ether ester provided (aa') does not comprise a compound of this kind.

If the mixture (a) is comprised exclusively of components (aa) and (ii), (aa) preferably comprises ethanol or isopropanol; if a component (c) is present, (aa) preferably comprises methanol or water.

The solvent (b) is present in the mixture in a quantitative proportion of from 0.1 to 8% by weight, preferably from 0.1 to 4.5% by weight. In particular in the case of representatives of these solvents, which have a boiling point in the upper region of the indicated range, it is advisable to add less than 4.5% by weight.

The mixture (a) comprises either (aa) and (ii) or (aa') and (ii) or one of these mixtures and additionally (c). The mixture (a) is preferably formed of three components. In any case one component can also comprise a mixture of at least two representatives of the same component.

In general, the polar component (aa) is present in a quantitative proportion of from about 0 to 70% by weight, preferably from 5 to 60% by weight, relative to the total solvent mixture. If the component (aa) comprises water it is preferably contained in the mixture in a quantity of not more than about 25% by weight; if (aa) comprises ethanol it is present in a quantity of at least about 25% by weight. Methanol, which is the preferred component (aa), generally is present in a quantitative proportion of from about 10 to 55% by weight, in particular from about 15 to 50% by weight.

Component (ii), which is always contained in the mixture (a), comprises, in general, a quantitative proportion of from about 3 to 70% by weight, preferably from about 5 to 60% by weight. Component (c) generally is present in a quantity of from about 0 to 70% by weight, preferably from about 15 to 65% by weight.

If (aa') is contained in the mixture it may be present in a quantity of from about 10 to 90% by weight. In the absence of an additional component (c), the quantity of component (aa') usually ranges between about 50 and 90%.

Examples of preferred solvent mixtures (a) include:
1. 1-ethoxy-2-propanol/butanone/methanol
2. 1-ethoxy-2-propanol/tetrahydrofuran/methanol
3. 1-ethoxy-2-propanol/butanone/water
4. 1-ethoxy-2-propanol/ethyl lactate/water
5. ethoxypropylacetate/butanone/methanol
6. 1-methoxy-2-propanol/butanone/methanol
7. 1-methoxy-2-propanol/ethylacetate/methanol
8. 1-methoxy-2-propanol/butanone/water
9. 1-methoxy-2-propanol/methanol/tetrahydrofuran
10. ethyl lactate/butanone/methanol
11. ethyl lactate/tetrahydrofuran/water
12. ethanol/butanone The preferred solvents (b) used comprise propylene carbonate, dimethylsulfoxide, diethylene glycol monomethylether, diethylene glycol dimethylether, diethylene glycol monoethylether, γ-butyrolactone and N-methyl pyrrolidone or mixtures thereof.

By the addition of the solvent (b) an increase in the photosensitivity of the coatings prepared therewith is achieved in virtually all instances. If more than about 5% by weight of the solvent (b) are added it has been found, however, that the effect of increasing the photosensitivity begins to decline. Furthermore, additions of more than about 4.5% by weight impair the uniformity of the layer during the drying operation. This occurs in particular when the higher-boiling solvent (b) has a boiling point above about 200° C., since in that case there is a higher risk of a cloudy layer structure being formed.

Further components of the coating solution prepared with the solvent mixture of the present invention comprise a photohardenable diazo compound and a polymeric binder. The diazo compound preferably is a diazonium salt polycondensation product; the preferred binder used comprises a water-insoluble polymer which is soluble in aqueous-alkaline solutions, in particular a polymer having carboxyl or sulfonylurethane side groups.

Particularly preferred binders comprise reaction products of an intramolecular anhydride of an organic polycarboxylic acid with a synthetic polymer containing hydroxyl groups and having no further functional groups which are capable of reaction with acid anhydrides.

The acid anhydride preferably is derived from a dicarboxylic or tricarboxylic acid, particularly from a dicarboxylic acid and may have one, two or several rings.

The products obtained from the reaction with maleic anhydride, phthalic anhydride, succinic anhydride or 3-oxaglutaric anhydride are preferred.

Synthetic polymers containing hydroxyl groups which can be used include, in particular, polymers having vinyl alcohol units, but also epoxy resins and saponified epoxy resins, copolymers of allyl alcohol or higher molecular weight unsaturated alcohols, polyhydroxyalkylacrylates and methacrylates and similar polymers.

Preferred polymers having vinyl alcohol units include partially saponified polyvinyl esters, polyvinyl acetals having free hydroxyl groups and corresponding reaction products of copolymers with vinyl ester units or vinyl acetal units or vinyl alcohol units.

The molecular weights of the binders having carboxyl groups are, in general, between 5,000 and about 200,000, preferably between 10,000 and 100,000. The acid numbers of the binders can generally vary between 5 and 80, preferably between 10 and 70. These preferred binders are described in detail in EP-A 0 152 819.

Preferred diazonium salt polycondensation products are condensation products of condensible aromatic diazonium salts, for example, of diphenylamine-4-diazonium salts, with aldehydes, preferably with formaldehyde. It is particularly advantageous to use cocondensation products comprising recurring units A-N₂X and B, which are linked by intermediate members, preferably methylene groups which are derived from condensible carbonyl compounds, A being the radical of an aromatic diazonium compound with is capable of condensation with formaldehyde and B being the radical of a compound which is free of diazonium groups and is capable of condensation with formaldehyde, particularly of an aromatic amine, phenol, phenol ether, aromatic thioether, aromatic hydrocarbon, aromatic heterocyclic compound and organic acid amide. These condensation products are described in DE-A 20 24 244. In general, all diazonium salt polycondensation products described in DE-A 27 39 774 can be used in the present invention.

The diazonium salt units A-N₂X are preferably derived from compounds of the formula $(R^1-R^2-)_pR^3-N_2X$, in which X is the anion of the diazonium compound,
p is an integer from 1 to 3,
$R^1$ is an aromatic radical which is capable of condensation with an active carbonyl compound in at least one position,
$R^3$ is a phenylene group, and
$R^2$ is a single bond or one of the groups:

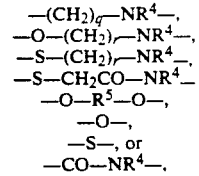

wherein
q is a number from 0 to 5,
r is a number from 2 to 5,
$R^4$ is a hydrogen atom, an alkyl group having from 1 to 5 carbon atoms, an aralkyl group having from 7 to 12 carbon atoms or an aryl group having from 6 to 12 carbon atoms, and
$R^5$ is an arylene group having from 6 to 12 carbon atoms.

The coating solutions according to the present invention generally comprise from about 5 to 90% by weight, preferably from about 10 to 70% by weight of diazonium compound and from about 95 to 10% by weight, preferably from about 90 to 30% by weight, of polymeric binder, relative to the sum of non-volatile components.

To stabilize the solution or the layer obtained therewith it is advisable to add a compound having acidic characteristics. Compounds which can be used include mineral acids and strong organic acids, with phosphoric acid, sulfuric acid, perchloric acid, boric acid or p-toluene sulfonic acid being preferred. Phosphoric acid is a particularly advantageous acid.

Plasticizers, adhesion promoters, dyes, pigments and color precursors can also be added to the solutions.

Preferred supports for coating with the solution of the present invention include, for example, magnesium, zinc, copper, mechanically-, chemically-, and electrochemically-roughened aluminum, anodically-oxidized aluminum, steel, and also polyester or cellulose acetate sheets, Perlon gauze etc., the surface of which may have been subjected to a pretreatment, if required. The support material may function as the final support or as a temporary support material from which the photosensitive layer is transferred by lamination to the workpiece to be processed.

The recording material which has been prepared using the photosensitive solutions serves, on the one hand, to produce images on suitable supports or receptor sheets and, on the other hand, to produce reliefs which are used as printing forms, screens, resists, and the like.

In addition, it is also possible to use the solutions for the preparation of lacquers which are hardenable by ultraviolet radiation and may be used for the protection of surfaces, or for the formulation of UV-hardenable printing inks.

Primarily, the solution is used for the production of planographic printing plates, in which aluminum is the preferred support material.

It is particularly preferred to pretreat the aluminum used for this purpose in the usual manner, for example, by a chemical or electrochemical roughening process which may be followed by an anodic oxidation. A further treatment of this support material, for example, with polyvinyl phosphonic acid, alkali metal silicate, phosphate, hexafluorozirconate, chromate, borate, polyacrylamide and cellulose derivatives is advantageous.

The recording materials obtained from the coating solutions are processed in the conventional manner, by exposing imagewise and washing-out the non-exposed areas of the layer with a suitable developer.

The recording material is exposed under an original, as is known in the art, using light sources which emit light with the highest possible spectral fraction in the near ultraviolet region. The material can also be exposed by laser irradiation. Suitable lasers for irradiation are shorter-wave lasers of appropriate power, for example, Ar lasers, krypton ion lasers, helium/cadmium lasers, emitting between about 300 and 600 nm and, for some layers, even $CO_2$ lasers, which emit at 10.6 $\mu$m, or YAG lasers emitting at 1.06 $\mu$m.

As the developer solutions, neutral or alkaline aqueous solutions are used, which have a pH value in the range from 6 to 14, preferably from 7.5 to 12, and which contain buffers salts, for example, water soluble alkali metal phosphates, silicates, borates, carbonates, acetates or benzoates. Additional constituents used are wetting agents, preferably anionic wetting agents and, if appropriate, water-soluble polymers. The solution can also contain minor amounts, for example, up to 5% by weight, preferably not more than 2% by weight, of water-miscible organic solvents. It is preferred to use difficultly volatile solvents, for example, araliphatic alcohols, the vapor pressure of which is of no consequence in the handling of the developer.

Development can be carried out in the conventional manner by dipping, spraying, brushing or wiping-over with a pad.

The invention is further illustrated by the examples which follow. In the following, percentages invariably relate to weight percent and quantitative proportions are weight proportions, unless otherwise indicated.

COMPARATIVE EXAMPLE C1

A coating solution comprising:
 4.17 g of the reaction product obtained from a polyvinyl butyral, having a molecular weight of about 70,000 to 80,000 and containing 71% of vinyl butyral units, 2% of vinyl acetate units and 27% of vinyl alcohol units, and maleic anhydride having an acid number of 30,
 1.41 g of a diazonium salt polycondensation product prepared from 1 mol of 3-methoxy-diphenylamine-4-diazonium sulfate and 1 mol of 4,4'-bis-methoxymethyl-diphenyl ether in 85% strength phosphoric acid and isolated as the mesitylene sulfonate,
 0.17 g of phosphoric acid (85% strength),
 0.20 g of Renol Blue B2G-HW (C.I. 74 160), 0.047 g of phenylazodiphenylamine in
 174 g of ethylene glycol monomethylether and
 20 g of butanone
is applied according to the kiss coating process to an aluminum foil which has been electrochemically grained in nitric acid, thereafter anodized in sulfuric acid and post-treated with polyvinyl phosphonic acid. The dry layer weight is 1.07 g/m$^2$.

The printing plate sample thus obtained is exposed for 20 seconds under a negative transparency, using a 5 kW metal halide lamp arranged at a distance of about 110 cm. The sample is then developed with a developer having the following composition:
 1.3 g of dodecylbenezene sulfonic acid/Na salt,
 4 g of ethylene glycol monophenyl ether
 2 g of Graham's salt,
 0.5 g of poly-N-vinyl-N-methylacetamide,
 4 g of pelargonic acid,
 1.4 g of KOH solid and
 1 g of $K_2B_4O_7$ 4 $H_2O$ in
 85.8 g of deionized water.

Development is carried out for 45 seconds using a plush pad.

In the process, the non-exposed layer areas are cleanly removed. Development is followed by rinsing with water. In the developed copy, step 5 of a silver film continuous tone step wedge having 13 steps and density increments of 0.15, is still reproduced as a solid step.

COMPARATIVE EXAMPLE C2

The solvent mixture comprising ethylene glycol monomethylether (methylglycol) and butanone as used in C1 is now replaced by a solvent mixture having a higher threshold limit value (TLV), namely by 1-ethoxy-2-propanol (BP 134° C., TLV 110 ppm), butanone (BP 79.6° C., TLV 200 ppm) and methanol (BP 65° C., TLV 200 ppm), i.e. 2-methoxyethanol is not used.

A coating solution comprising:
 4.17 g of the polymer described in C1,
 1.41 g of the diazonium salt polycondensate described in C1,
 0.17 g of phosphoric acid (85% strength),
 0.20 g of Renol Blue B2G-HW (C.I. 74 160),
 0.047 g of phenylazodiphenylamine in
 77.6 g of 1-ethoxy-2-propanol,
 58.2 g of methylethylketone and
 58.2 g of methanol
is coated upon the aluminum support as used in C1 to give a layer weight of 1.05 g/m$^2$. Exposure and development of the photosensitive layer are also carried out as described in C1. Contrary to C1, however, the copy obtained now shows only a solid step 3, i.e., after eliminating 2-methoxyethanol the layer has a photosensitivity which is reduced by two wedge steps.

EXAMPLE 1

One percent by weight (=1.94 g) of propylene carbonate (BP 241° C.), relative to the total quantity of solvent, is added to the following coating solution, at the expense of the quantity of methanol used in C2.

A coating solution comprising:
 4.17 g of the polymer described in C1,
 1.41 g of the diazonium salt polycondensate described in C1,
 0.17 g of phosphoric acid (85% strength),
 0.20 g of Renol Blue B2G-HW (C.I. 74 160),
 0.047 g of phenylazodiphenylamine in
 77.6 g of 1-ethoxy-2-propanol,
 58.2 g of methylethylketone,
 56.26 g of methanol,
 1.94 g of propylene carbonate
is coated upon the aluminum support as used in C1 to give a layer weight of 1.14 g/m$^2$ and is exposed and developed as in C1. In this case, the copy again shows a solid step 5.

EXAMPLE 2

The quantity of 1.94 g of propylene carbonate used in Example 1 is replaced by 1.94 g of dimethylsulfoxide (BP 189° C.). After processing the coating solution in the same manner as in C1, a layer weight of 1.03 g/m$^2$ results. As in C1 the copy shows a solid step 5.

EXAMPLE 3

The propylene carbonate of Example 1 is replaced by 1.94 g of diethylene glycol monomethylether (BP 193° C.). After processing the coating solution as in C1, a layer weight of 1.07 g/m$^2$ is obtained. As in Examples C1, 1 and 2, the copy shows a solid step 5.

EXAMPLE 4

In place of the propylene carbonate of Example 1, 1.94 g of γ-butyrolactone (BP 204° C.) is added. After processing in the same manner as in C1, a layer weight of 1.0 g/m$^2$ results. As in Examples C1 and 1 to 3, the copy shows a solid step 5.

COMPARATIVE EXAMPLE C3 AND EXAMPLES 5 TO 7

In the following examples the solvent system used comprises 1-ethoxy-2-propanol/methanol/tetrahydrofuran.

4.17 g of the polymer described in C1,
1.41 g of the diazonium salt polycondensate described in C1,
0.168 g of phosphoric acid (85% strength),
0.20 g of Renol Blue B2G-HW (C.I. 74 160),
0.047 g of phenyl-azodiphenylamine are dissolved in 194 g of the solvent system indicated in Table 1 and are further processed as in C1. The following results are obtained:

TABLE 1

| Solvent | Boiling Point °C. | Examples | | | |
|---|---|---|---|---|---|
| | | C3 | 5 | 6 | 7 |
| 1-Ethoxy-2-propanol | 134 | 30% | 30% | 30% | 30% |
| Methanol | 64 | 30% | 29% | 28% | 26% |
| Tetrahydrofuran | 66 | 40% | 40% | 40% | 40% |
| Propylene carbonate | | — | 1% | 2% | 4% |
| Layer weight g/m$^2$ | | 0.96 | 1.09 | 1.05 | 0.97 |
| Solid step | | 3 | 5 | 5-6 | 5-6 |

COMPARATIVE EXAMPLE C4 AND EXAMPLES 8 TO 10

In the following examples the solvent system used comprises 1-ethoxy-2-propanol/methylethyl-ketone/water.

4.17 g of the polymer described in C1,
1.41 g of the diazonium salt polycondensate described in C1,
0.168 g of phosphoric acid (85% strength),
0.20 g of Renol Blue B2G-HW (C.I. 74 160),
0.047 g of phenylazodiphenylamine 0.030 g of a modified siloxaneglycol copolymer (additive) are dissolved in
194 g of the solvent mixture specified in Table 2.

After coating, the layer obtained is exposed for 30 seconds and further processed as in C1. The following results are obtained:

TABLE 2

| Solvent | Boiling Point °C. | Examples | | | |
|---|---|---|---|---|---|
| | | C4 | 8 | 9 | 10 |
| 1-Ethoxy-2-propanol | 134 | 40% | 40% | 40% | 40% |
| Water, demineralized | 100 | 20% | 20% | 20% | 20% |
| Methylethylketone | 79.6 | 40% | 39% | 38% | 36% |
| Propylene carbonate | 241 | — | 1% | 2% | 4% |
| Layer weight g/m$^2$ | | 0.96 | 1.48 | 1.47 | 1.41 |
| Solid step | | 4 | 5 | 5 | 5 |

COMPARATIVE EXAMPLE C5 AND EXAMPLES 11 TO 13

In the following examples the solvent system used comprises 1-ethoxy-2-propanol/ethyl lactate/water.

4.17 g of the polymer described in C1,
1.41 g of the diazonium salt polycondensate in C1,
0.168 g of phosphoric acid (85% strength),
0.20 g of Victoria Pure Blue FGA (C.I. Basic Blue 81),
0.047 g of phenylazodiphenylamine
0.020 g of a modified siloxaneglycol copolymer are dissolved in
194 g of the solvent mixture specified in Table 3.

After coating, the layer obtained is exposed for 35 seconds and further processed as in C1. The following results are obtained:

TABLE 3

| Solvent | Boiling Point °C. | Examples | | | |
|---|---|---|---|---|---|
| | | C5 | 11 | 12 | 13 |
| 1-Ethoxy-2-propanol | 134 | 50% | 50% | 50% | 50% |
| Ethyl lactate | 154 | 40% | 39% | 38% | 36% |
| Water, demineralized | 100 | 10% | 10% | 10% | 10% |
| Propylene carbonate | 241 | — | 1% | 2% | 4% |
| Layer weight g/m$^2$ | | 2.02 | 1.86 | 2.0 | 1.94 |
| Solid step | | 4 | 5 | 5 | 5 |

COMPARATIVE EXAMPLE C6 AND EXAMPLES 14 TO 17

In the following examples the solvent system used comprises ethoxypropylacetate/methylethylketone/methanol which also produces an increase in photosensitivity, when small amounts of a higher-boiling solvent are added.

4.17 g of the polymer described in C1,
1.41 g of the diazonium salt polycondensate described in C1,
0.17 g of phosphoric acid (85% strength),
0.20 g of Renol Blue B2G-HW (C.I. 74 160),
0.047 g of phenylazodiphenylamine are dissolved in
194 g of the solvent mixture indicated in Table 4, coated upon an aluminum support according to C1 and exposed and developed as in C1. The following results are then obtained:

TABLE 4

| Solvent | Boiling Point °C. | Examples | | | | |
|---|---|---|---|---|---|---|
| | | C6 | 14 | 15 | 16 | 17 |
| Ethoxypropylacetate | 174.5 | 40% | 40% | 40% | 40% | 40% |
| Methylethylketone | 79.6 | 30% | 30% | 30% | 30% | 30% |
| Methanol | 65 | 30% | 29% | 29% | 29% | 29% |
| Propylene carbonate | 241 | — | 1% | — | — | — |
| Dimethylsulfoxide | 189 | — | — | 1% | — | — |
| Diglycol monomethylether | 193 | — | — | — | 1% | — |

TABLE 4-continued

| Solvent | Boiling Point °C. | Examples | | | | |
|---|---|---|---|---|---|---|
| | | C6 | 14 | 15 | 16 | 17 |
| γ-Butyrolactone | 204 | — | — | — | — | 1% |
| Layer weight g/m² | | 1.06 | 1.08 | 1.02 | 1.01 | 1.01 |
| Solid step | | 3 | 5 | 4 | 4 | 4 |

COMPARATIVE EXAMPLE C7

The solvent mixture composed of ethylene glycol monomethylether and methylethylketone as used in C1 is here replaced by 1-methoxy-2-propanol (BP 122° C., TLV 100 ppm), methylethylketone and methanol.

A coating solution comprising 4.17 g of the polymer described in C1,
1.41 g of the diazonium salt polycondensate described in C1,
0.17 g of phosphoric acid (85% strength),
0.20 g of Renol Blue B2G-HW (C.I. 74 160),
0.047 g of phenylazodiphenylamine,
64.2 g of 1-methoxy-2-propanol,
48.2 g of methylethylketone and
48.2 g of methanol is applied to the same aluminum support as used in C1 to give a layer weight of 1.05 g/m². The photosensitive layer is exposed and developed according to C1. As against C1, the copy obtained now shows only a solid step 4, i.e. after eliminating methylglycol the photosensitivity of the layer is reduced by one wedge step. Gradation is also flatter.

EXAMPLE 18

In the following coating solution, 1% by weight (=1.606 g) of propylene carbonate (BP 241° C.) relative to the total quantity of solvent (=160.6 g) is added, at the expense of the quantity of methanol employed in C7.

A coating solution comprising:

4.17 g of the polymer described in C1,
1.41 g of the diazonium salt polycondensate described in C1,
0.17 g of phosphoric acid (85% strength),
0.20 g of Renol Blue B2G-HW (C.I. 74 160),
0.047 g of phenylazodiphenylamine in
64.2 g of 1-methoxy-2-propanol,
48.2 g of methylethylketone,
46.594 g of methanol and
1.606 g of propylene carbonate is applied to an aluminum support according to C1 to give a layer weight of 1.04 g/m². After exposure and development as in C1, the copy shows again a solid step 5, and also the steeper gradation of C1 is again present.

EXAMPLE 19

In the following coating solution, the propylene carbonate according to Example 18 is replaced by 1.606 g of dimethylsulfoxide (BP 189° C.) and the solution is processed as in C1. A layer weight of 1.04 g/m² is obtained. As in C1 and Example 18, a solid step 5 is present in the copy and the steep gradation of C1 is attained.

EXAMPLE 20

The propylene carbonate of Example 18 is replaced by 1.606 g of diglycol monomethylether (BP 193° C.). After processing the coating solution as in C1, a layer weight of 1.01 g/m² is obtained. As in Examples C1, 18 and 19, the copy shows a solid step 5.

EXAMPLE 21

In place of the propylene carbonate used in Example 18, 1.606 g of γ-bulyrolactone (BP 204° C.) is added. After processing the coating solution in the same manner as in C1, a layer weight of 1.05 g/m² results. As in Examples C1 and 18 to 20 the copy shows a solid step 5 and the steep gradation according to C1 is again obtained.

COMPARATIVE EXAMPLE C8 AND EXAMPLES 22 to 29

In this series of experiments, the dependence of photosensitivity on the concentration of the higher-boiling solvent (propylene carbonate) is illustrated for the concentration range from 0.1 to 4.17 g of the polymer described in C1,
1.41 g of the diazonium salt polycondensate described in C1,
0.17 g of phosphoric acid (85% strength),
0.20 g of Renol Blue B2G-HW (C.I. 74 160),
0.047 g of phenylazodiphenylamine are dissolved in
194 g of the solvent mixture specified in Tables 5 and 6 and further processed as in C1. The results obtained are compiled in Tables 5 and 6.

TABLE 5

| Solvent | Boiling Point °C. | Examples | | | | |
|---|---|---|---|---|---|---|
| | | C8 | 22 | 23 | 24 | 25 |
| Methoxypropanol | 122 | 40% | 40% | 40% | 40% | 40% |
| Methanol | 79.6 | 30% | 30% | 30% | 30% | 30% |
| Tetrahydrofuran | 65 | 30% | 29.9% | 29.75% | 29.5% | 29% |
| Propylene carbonate | 241 | — | 0.1% | 0.25% | 0.5% | 1% |
| Layer weight g/m² | | 1.05 | 1.04 | 1.04 | 1.04 | 1.04 |
| Solid step | | 4 | 4-5 | 5 | 5 | 5 |

TABLE 6

| Solvent | Boiling Point °C. | Examples | | | | |
|---|---|---|---|---|---|---|
| | | C8 | 26 | 27 | 28 | 29 |
| Methoxypropanol | 122 | 40% | 40% | 40% | 40% | 40% |
| Methylethylketone | 79.6 | 30% | 30% | 30% | 30% | 30% |
| Methanol | 65 | 30% | 28% | 27% | 25% | 23% |
| Propylene carbonate | 241 | — | 2% | 2% | 5% | 7% |
| Layer weight g/m² | | 1.05 | 1.02 | 1.0 | 1.01 | 1.02 |
| Solid step | | 4 | 6 | 6 | 6 | 5-6 |

COMPARATIVE EXAMPLE C9 AND EXAMPLES 30 TO 32

In the following examples, a lower ratio between binder and diazonium salt of 2:1 and a different dye are employed. Coating, exposure and development are carried out as described in C1.

54.48 g of a 7.8% strength solution in methylethylketone of the polymer described in C1,
2.12 g of the diazonium salt polycondensate described in C1,
0.25 g of phosphoric acid (85% strength),
0.30 g of Victoria Pure Blue FGA (C.I. Basic Blue 81), 0.07 g of phenylazodiphenylamine, 142.77 g of the solvent mixture according to Table 7, such that the total quantity of solvent inclusive of the 50.23 g of methylethylketone from the 7.8 strength polymer solution is 193 g.

TABLE 7

| Solvent | Boiling Point °C. | Examples | | | |
|---|---|---|---|---|---|
| | | C9 | 30 | 31 | 32 |
| 1-Methoxy-2-propanol | 122 | 54% | 53.5% | 51.5% | 49% |
| Methanol | 79.6 | 26% | 26% | 26% | 26% |
| Tetrahydrofuran | 65 | 20% | 20% | 20% | 20% |
| Propylene carbonate | 241 | — | 0.5% | 2.5% | 5% |
| Layer weight g/m² | | 1.0 | 1.0 | 1.06 | 1.07 |
| Solid step | | 3 | 3-4 | 4 | 4 |

In the following examples, a ratio binder/diazonium salt of 1:1 is used.

COMPARATIVE EXAMPLE C10

A coating solution comprising:
36.78 g of an 8.1% strength solution in methylethylketone of the polymer described in C1,
2.98 g of the diazonium salt polycondensate described in C1,
0.136 g of phosphoric acid (85% strength),
0.78 g of Renol Blue B2G-HW (C.I. 74 160),
0.05 g of phenylazodiphenylamine,
77.22 g of 1-methoxy-2-propanol,
57.91 g of methanol,
24.11 g of methylethylketone (total quantity 57,91 g) is applied, according to C1, to the aluminum support described in that example to give a dry layer weight of 1.05 g/m². The layer obtained is exposed and developed as in C1. A solid step 4 is obtained.

EXAMPLE 33

A coating solution according to C10 is prepared, but which comprises:
55.98 g of methanol (instead of 57.91 g) and additionally
1.93 g of propylene carbonate (=1% by weight of the total quantity of solvent).
The solution is processed as specified in C1. The dry layer weight is again 1.05 g/m². A solid step 5 is obtained.

EXAMPLE 34

A coating solution according to Example 33 is prepared, but instead of 1.93 g of propylene carbonate, 1.93 g of methylpyrrolidone is used. A layer weight of 1.0 g/m² results. The copy shows a solid step 5.

COMPARATIVE EXAMPLE C11 AND EXAMPLES 35 TO 37

In the following examples the solvent system used comprises 1-methoxy-2-propanol/methanol/ethylacetate.
4.17 g of the polymer described in C1,
1.41 g of the diazonium salt polycondensate described in C1,
0.168 g of phosphoric acid (85% strength),
0.20 g of Renol Blue B2G-HW (C.I. 74 160),
0.047 g of phenylazodiphenylamine are dissolved in
194 g of the solvent mixture specified in Table 8 and further processed according to C1.

TABLE 8

| Solvent | Boiling Point °C. | Examples | | | |
|---|---|---|---|---|---|
| | | C11 | 35 | 36 | 37 |
| 1-Methoxy-2-propanol | 122 | 40% | 40% | 40% | 40% |
| Methanol | 65 | 40% | 39% | 38% | 36% |
| Ethylacetate | 72.2 | 20% | 20% | 20% | 20% |
| Propylene carbonate | 241 | — | 1% | 2% | 4% |
| Layer weight g/m² | | 1.00 | 1.06 | 0.95 | 0.95 |
| Solid step | | 4 | 5 | 6 | 6 |

COMPARATIVE EXAMPLE C12 AND EXAMPLES 38 TO 40

The following examples are carried out using the solvent system 1-methoxy-2-propanol/methylethylketone/water and a diazo compound which is relatively easily soluble in water.
A coating solution is prepared from:
2.56 g of the polymer described in C1,
2.56 g of the diazonium salt polycondensation product prepared from 1 mol of 3-methoxy-diphenylamine-4-diazonium sulfate and 1 mol of 4,4'-bis methoxymethyl-diphenylether in an 85% strength phosphoric acid and isolated as the methane sulfonate,
0.118 g of phosphoric acid (85% strength),
0.5 g of Renol Blue B2G-HW (C.I. 74 160),
0.046 g of phenylazodiphenylamine,
0.02 g of a modified siloxaneglycol copolymer (additive), dissolved in
194 g of the solvent mixture specified in Table 9.
The solution is further processed according to C1. The following results are obtained:

TABLE 9

| Solvent | Boiling Point °C. | Examples | | | |
|---|---|---|---|---|---|
| | | C12 | 38 | 39 | 40 |
| 1-Methoxy-2-propanol | 122 | 50% | 50% | 50% | 50% |
| Methanol | 79.6 | 30% | 29% | 28% | 26% |
| Tetrahydrofuran | 72.2 | 20% | 20% | 20% | 20% |
| Propylene carbonate | 241 | — | 1% | 2% | 4% |
| Layer weight g/m² | | 1.07 | 1.11 | 1.02 | 1.14 |
| Solid step | | 3 | 4-5 | 4-5 | 4-5 |

COMPARATIVE EXAMPLE C13

A coating solution comprising
30.16 g of a 12% strength solution in tetrahydrofuran of the reaction product obtained by reacting the polyvinyl butyral indicated in C1 with propenyl sulfonyl isocyanate, having an acid number of 144,
1.81 g of the diazonium salt polycondensate described in C1,
0.21 g of phosphoric acid (85% strength),
0.25 g of Victoria Pure Blue FGA (C.I. Basic Blue 81),
0.06 g of phenylazodiphenylamine, 128.66 g of 1 methoxy-2-propanol,
38.8 g of methanol
is applied according to C1 to the aluminum support specified in that example to give a layer weight of 1.02 g/m². After exposure and development according to C1 a solid wedge step 3 is obtained

EXAMPLE 41

A coating solution comprising 30.16 g of a 12% strength solution in tetrahydrofuran of the polymer described in C13, 1.81 g of the diazonium salt polycondensate described in C1,
0.21 g of phosphoric acid (85% strength),
0.25 g of Victoria Pure Blue FGA (C.I. Basic Blue 81),
0.06 g of phenylazodiphenylamine, 126.72 g of 1 methoxy-2-propanol,
38.8 g of methanol and
1.94 g of propylene carbonate is applied to an aluminum support as used in C1 to give a dry layer weight of 1.03 g/m². After exposure and development according to C1 it is found that the photosensitivity of the layer is about ½ wedge step higher than in the case of the layer of C13.

COMPARATIVE EXAMPLE C14 AND EXAMPLES 42 TO 44

Also the solvent system comprising ethyl lactate/methanol/methylethylketone, when used with an addition of minor amounts of a higher-boiling solvent, shows a photosensitivity-increasing effect.

A coating solution is prepared from:
3.0 g of the polymer described in C1,
3.0 g of the diazonium salt polycondensate described in C1,
0.138 g of phosphoric acid (85% strength),
0.79 g of Renol Blue B2G-HW (C.I. 74 160),
0.054 g of phenylazodiphenylamine, dissolved in
193 g of the solvent mixture specified in Table 10 and further processed as in C1. The following results are obtained:

TABLE 10

| Solvent | Boiling Point °C. | C14 | 42 | 43 | 44 |
|---|---|---|---|---|---|
| Ethyl lactate | 154 | 20% | 20% | 20% | 20% |
| Methanol | 65 | 20% | 19% | 18% | 16% |
| Methylethylketone | 79.6 | 60% | 60% | 60% | 60% |
| Propylene carbonate | 241 | — | 1% | 1% | 4% |
| Layer weight g/m² | | 0.98 | 1.0 | 1.01 | 1.0 |
| Solid step | | 4 | 5 | 5 | 5 |

COMPARATIVE EXAMPLE C15 AND EXAMPLES 45 TO 47

The solvent system used in the following examples comprises ethyl lactate/tetrahydrofuran/water.

A coating solution is prepared from:
2.56 g of the polymer described in C1,
2.56 g of the diazonium salt polycondensate described in C1,
0.118 g of phosphoric acid (85% strength),
0.68 g of Renol Blue B2G-HW (C.I. 74 160),
0.046 g of phenylazodiphenylamine, dissolved in
194 g of the solvent mixture specified in Table 11 and further processed as in C1. The following results are obtained:

TABLE 11

| Solvent | Boiling Point °C. | C15 | 45 | 46 | 47 |
|---|---|---|---|---|---|
| Ethyl lactate | 122 | 40% | 40% | 40% | 40% |
| Tetrahydrofuran | 79.6 | 30% | 30% | 30% | 30% |
| Water | 65 | 30% | 29.75% | 29.5% | 29% |
| Propylene carbonate | 241 | — | 0.25% | 0.5% | 1% |
| Layer weight g/m² | | 1.05 | 1.04 | 1.04 | 1.04 |

TABLE 11-continued

| Solvent | Boiling Point °C. | C15 | 45 | 46 | 47 |
|---|---|---|---|---|---|
| Solid step | | 4 | 5 | 5 | 5 |

In the following examples a solvent mixture comprising ethanol/methylethylketone and a binder/diazonium salt in a ratio of 1:1 are used.

COMPARATIVE EXAMPLE C16

A coating solution comprising:
38.2 g of a 7.8% strength solution in methylethylketone of the polymer described in C1,
2.98 g of the diazonium salt polycondensate described in C1,
0.136 g of phosphoric acid (85% strength), 0.78 g of Renol Blue B2G-HW (C.I. 74 160),
0.05 g of phenylazodiphenylamine,
115.8 g of ethanol,
41.97 g of methylethylketone is applied according to C1 to the aluminum support described in that example. A layer weight of 1.0 g/m² is obtained. The photosensitive layer is exposed and developed as in C1. The copy shows a solid step 4.

EXAMPLE 48

A coating solution comprising
38.2 g of a 7.8% strength solution in methylethylketone of the polymer described in C1,
2.98 g of the diazonium salt polycondensate described in C1,
0.136 g of phosphoric acid (85% strength),
0.78 g of Renol Blue B2G-HW (C.I. 74 160),
0.05 g of phenylazodiphenylamine,
115.8 g of ethanol,
40.04 g of methylethylketone,
1.93 g of γ-butyrolactone (1% of the total quantity of solvent)

is applied according to C1 to the aluminum support described in that example. A layer weight of 1.01 g/m² is obtained. Exposure and development are carried out as in C1. Contrary to C16, a solid step 5 of the exposure wedge is now obtained.

EXAMPLE 49

A coating solution is prepared according to Example 48, but using 1.93 g of propylene carbonate instead of γ-butyrolactone. After processing according to C1, the copy shows also in this case a solid wedge step 5.

EXAMPLE 50

A coating solution is prepared according to Example 48, but using 1.93 g of diethylene glycol monomethylether instead of γ-butyrolactone. After processing according to C1 a layer weight of 0.97 g/m² results. A solid step 5 is obtained in the copy.

EXAMPLE 51

A coating solution is prepared according to Example 48, but using 1.93 g of diethylene glycol dimethylether instead of γ-butyrolactone. After processing according to C1 a layer weight of 0.96 g/m² results. A solid step 5 is obtained in the copy.

EXAMPLE 52

A coating solution is prepared according to Example 48, but using 1.93 g of diethylene glycol ethylether instead of γ-butyrolactone. After processing according to C1 a layer weight of 0.98 g/m² results. A solid step 5 is obtained in the copy.

The photosensitivity of negative-working layers applied from solvent mixtures containing methylglycol can also be increased by the addition of a higher-boiling solvent. This is shown by the following examples:

COMPARATIVE EXAMPLE C17 AND EXAMPLES 53 TO 56

A coating solution comprising 3.47 g of the polymer described in C1,
1.17 g of the diazonium salt polycondensate described in C1,
0.14 g of phosphoric acid (85% strength),
0.167 g of Renol Blue B2G-HW (C.I. 74 160),
0.039 g of phenylazodiphenylamine, dissolved in
195 g of the solvent mixture specified in Table 12 is further processed as in C1. The following results are obtained:

TABLE 12

| Solvent | Boiling Point °C. | Examples | | | | |
|---|---|---|---|---|---|---|
| | | C17 | 53 | 54 | 55 | 56 |
| Ethylene glycol mono-methyl-ether | 124.5 | 89.7% | 89.7% | 89.7% | 89.7% | 89.7% |
| Myethyl-ethylketone | 79.6 | 10.3% | 9.3% | 8.3% | 5.3% | 3.3% |
| Propylene carbonate | 241 | — | 1% | 2% | 5% | 7% |
| Layer weight g/m² | | 1.01 | 1.01 | 1.0 | 0.98 | 1.05 |
| Solid step | | 5 | 5-6 | 6 | 6 | 5 |

Similarly to Tables 5 and 6, Table 12 also shows that in the case of adding more than about 5% by weight of the higher-boiling solvent, the photosensitivity of the layers decreases again.

The photosensitive compositions can also contain small particles which have an average diameter between 1 an 10 μm, but which are at least of the same size as the thickness of the photosensitive layer, and which produce a rough surface of the negative printing plates, in order to reduce in this way the evacuating time in the exposure frame.

Particles which are suitable for use comprise inorganic pigments, such as silicon oxide, aluminum oxide, aluminum silicate, zinc oxide, titanium oxide and others or organic polymer particles.

Besides, it is possible to add surface-active substances such as, for example, methylpolysiloxanes or fluorinated surfactants to the photosensitive compositions to improve their levelling characteristics.

What is claimed is:

1. A coating solution for the production of a negative-working photosensitive recording material, which includes in admixture, a negative-working photohardenable diazo compound, a polymeric binder, and a solvent mixture which dissolves the diazo compound and the polymeric binder, wherein the solvent mixture comprises in admixture (a) a first component comprising
  (i) a first constituent comprising either
    (aa) a polar solvent of the formula R—OH, wherein R is an alkyl group having from 1 to 3 carbon atoms, or
    (aa') a monoalkylether or an alkylether ester of propylene glycol and
  (ii) a second constituent comprising an organic solvent having a boiling point in the range of from about 60° to 160° C. and which is selected from the group consisting of an aliphatic ketone, an alkanoic acid alkylester, a hydroxyalkanoic acid alkylester and a cyclic ether, and
  (iii) a third constituent comprising an organic solvent having a boiling point in the range of from about 120° to 180° C. and which comprises a monoalkylether or an alkylether ester of propylene glycol or an alkylester of a hydroxyalkanoic acid,
  with the proviso that solvent (iii) can not be a monoalkylether or an alkylether ester of propylene glycol and solvent (ii) can not be an alkylester of a hydroxyalkanoic acid if component (aa') is present and the proviso that solvent (iii) can not be an alkylester of a hydroxyalkanoic acid, if component (ii) is an alkylester of a hydroxyalkanoic acid,
wherein solvents (i), (ii), and (iii) are present in quantitative proportions selected to form a homogeneous mixture, and
(b) from about 0.1 to 8% by weight, relative to the total solvent mixture, of a second component comprising a solvent, the boiling point of which is in the range from about 160° to 250° C. and is higher than each individual boiling point of the constituents of the first component (a), and which is selected from the group consisting of lactones, cyclic esters other than lactones, sulfoxides and lactams
wherein the types and proportions of ingredients are selected so as to give a solution useful for the production of a negative-working photosensitive recording material.

2. A coating solution as recited in claim 1, wherein the binder is insoluble in water and soluble in aqueous-alkaline solutions.

3. A coating solution as recited in claim 2, wherein the binder comprises a reaction product of an intramolecular anhydride of an organic polycarboxylic acid with a polymer having hydroxyl groups and no further functional groups capable of reaction with acid anhydrides.

4. A coating solution as recited in claim 1, wherein the photohardenable compound comprises a diazonium salt polycondensation product.

5. A coating solution as recited in claim 4, wherein the diazonium salt polycondensation product comprises recurring units A-N₂X and B, which are linked by intermediate members which are derived from condensible carbonyl compounds, A being the radical of an aromatic diazonium compound which is capable of condensation with formaldehyde and B being the radical of a compound which is free of diazonium groups and is capable of condensation with formaldehyde, wherein the diazonium-free compound is selected from the group consisting of an aromatic amine, a phenol, phenol ether, aromatic thioether, an aromatic hydrocarbon, an aromatic heterocyclic compound and an organic acid amide.

6. A coating solution as recited in claim 5, wherein the units A-N₂X are derived from compounds having the general formula $(R^1-R^2-)_pR^3-N_2X$, wherein
X is the anion of the diazonium compound,
p is an integer from 1 to 3,
$R^1$ is an aromatic radical which is capable of condensation with an active carbonyl compound in at least one position,
$R^3$ is a phenylene group, and
$R^2$ is a single bond or one of the groups:

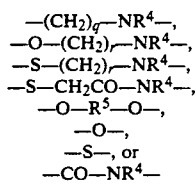

wherein
q is a number from 0 to 5,
r is a number from 2 to 5,
$R^4$ is a hydrogen atom, an alkyl group having from 1 to 5 carbon atoms, an aralkyl group having from 7 to 12 carbon atoms or an aryl group having from 6 to 12 carbon atoms, and
$R^5$ is an arylene group having from 6 to 12 carbon atoms.

7. A coating solution as recited in claim 4, wherein the diazonium salt polycondensation product comprises a condensation product of condensible aromatic diazonium salts with aldehydes.

8. A coating solution as recited in claim 1 comprising about 5 to 70% of (aa) or about 10 to 90% of (aa'), about 3 to 70% of (ii), and about 15 to 70% of (iii), wherein the percents are based on the total weight percent of the solvent mixture.

9. A coating solution as recited in claim 8 comprising about 5 to 90% by weight of the photohardenable compound and about 10 to 95% by weight of the polymeric binder, each percent being relative to the sum of non-volatile components.

10. A coating solution as claimed in claim 1, wherein component (i) comprises (aa) and is selected from the group consisting of, methanol, ethanol, n-propanol, and isopropanol.

11. A coating solution as claimed in claim 1, wherein component (ii) is selected from the group consisting of acetone, butanone, pentanone, and methylisobutyl ketone.

12. A coating solution as claimed in claim 1, wherein component (ii) is selected from the group consisting of esters of acetic, propionic, butyric, glycolic, and lactic acid.

13. A coating solution as claimed in claim 1, wherein component (ii) is selected from the group consisting of tetrehydrofuran, tetrahydropyran, and dioxane.

14. A coating solution as claimed in claim 1, wherein component (b) is selected from the group consisting of butyrolactone, valerolactone, ethylene carbonate, propylene carbonate, dimethylsulfoxide, diethylsulfoxide, N-methylpyrrolidone, and N-ethylpyrrolidone.

15. A coating solution as claimed in claim 1, wherein component (iii) comprises an alkylether ester or alkylether having from 1 to 2 carbon atoms in the alkyl group.

16. A coating solution as claimed in claim 1, wherein a solvent (aa) is present and solvent (iii) comprises a monoalkylether or an alkylether ester of propylene glycol.

17. A coating solution as claimed in claim 1, wherein solvent (iii) comprises an alkylester of a hydroxyalkanoic acid.

18. A coating solution as claimed in claim 1, wherein the solvent mixture comprises a monoalkylether or an alkylether ester of propylene glycol.

19. A coating solution as claimed in claim 18, wherein the solvent mixture comprises substantially no ethylene glycol ethers or ethylene glycol ether esters.

20. A coating solution as claimed in claim 1, wherein solvent (i) comprises methanol, solvent (ii) comprises butanone or tetrahydrofuran, and solvent (iii) comprises a monoalkylether or an alkylether ester of propylene glycol.

21. A negative working photosensitive recording material having a support and a photohardenable layer obtained by applying a coating solution according to claim 1 to the support and drying.

22. A negative working planographic printing plate having an aluminum support and a photohardenable layer obtained by applying a coating solution according to claim 1 to the support and drying.

* * * * *